(12) United States Patent
Denda et al.

(10) Patent No.: US 6,858,446 B2
(45) Date of Patent: *Feb. 22, 2005

(54) PLASMA MONITORING METHOD AND SEMICONDUCTOR PRODUCTION APPARATUS

(75) Inventors: Atsushi Denda, Chino (JP); Yoshinao Ito, Chino (JP)

(73) Assignee: Seiko Epson Corporation, Tokyo (JP)

( * ) Notice: Subject to any disclaimer, the term of this patent is extended or adjusted under 35 U.S.C. 154(b) by 103 days.

This patent is subject to a terminal disclaimer.

(21) Appl. No.: 10/139,536

(22) Filed: May 6, 2002

(65) Prior Publication Data

US 2002/0124959 A1 Sep. 12, 2002

Related U.S. Application Data

(62) Division of application No. 09/287,612, filed on Apr. 7, 1999, now Pat. No. 6,440,260.

(30) Foreign Application Priority Data

Jul. 10, 1998 (JP) ........................................... 10-211834

(51) Int. Cl.$^7$ ............................. H01L 21/00; H05H 1/00
(52) U.S. Cl. ............................ 438/10; 438/710; 216/61; 156/345.24; 118/712
(58) Field of Search ..................... 438/10, 710; 216/61; 156/345.24, 345.43, 345.47; 118/712; 723 E

(56) References Cited

U.S. PATENT DOCUMENTS

| 4,207,137 A | 6/1980 | Tretola ........................ 156/627 |
| 4,358,338 A | 11/1982 | Downey et al. ............. 156/627 |
| 4,602,981 A | 7/1986 | Chen et al. .................. 156/627 |
| 5,016,663 A | 5/1991 | Mase et al. |
| 5,228,939 A | 7/1993 | Chu ............................ 156/345 |
| 5,273,610 A | 12/1993 | Thomas, III et al. ....... 156/345 |
| 5,314,603 A | 5/1994 | Sugiyama et al. |
| 5,330,615 A | 7/1994 | Chu ............................ 156/643 |
| 5,472,561 A | 12/1995 | Williams et al. .......... 156/627.1 |
| 5,556,549 A | 9/1996 | Patrick et al. ................ 216/61 |
| 5,565,737 A | 10/1996 | Keane .................... 315/111.21 |
| 5,576,629 A | 11/1996 | Turner et al. ............... 324/709 |
| 5,830,310 A | 11/1998 | Doi |
| 5,910,011 A | 6/1999 | Cruse ........................... 438/16 |
| 5,939,886 A | 8/1999 | Turner et al. ............... 324/464 |
| 5,971,591 A | 10/1999 | Vona et al. ............ 364/478.08 |
| 6,447,691 B1 | 9/2002 | Denda et al. ................. 216/61 |

FOREIGN PATENT DOCUMENTS

| JP | 61-256637 | 11/1986 |
| JP | 63-244739 | 10/1988 |
| JP | 64-090533 | 4/1989 |
| JP | 02-195698 | 8/1990 |
| JP | 5-28895 | 4/1993 |
| JP | 05-205898 | 8/1993 |
| JP | 06-260298 | 12/1994 |
| JP | 08-193271 | 7/1996 |
| JP | 08-339896 | 12/1996 |
| JP | 10-041097 | 2/1998 |

OTHER PUBLICATIONS

Notice of Reasons of Rejection for Japanese Patent Application No. 10–211834, dated Aug. 19, 2003, which lists JP10–041097, JP08–339896, JP02–195698, JP64–090533, and JP06–260298.

Primary Examiner—Parviz Hassanzadeh
(74) Attorney, Agent, or Firm—Konrad Raynes & Victor, LLP; Alan S. Raynes

(57) ABSTRACT

In certain embodiments a plasma is supplied from a plasma chamber 10 into a reaction chamber 18 of a plasma CVD apparatus. An electrode 22 is disposed in the reaction chamber 18. A semiconductor wafer on which a thin film is to be formed is placed on the electrode 22. A radio-frequency wave is generated by a radio-frequency wave generator 28 and supplied to the electrode 22 via a radio-frequency matching network 30, a blocking capacitor 32, and an RF probe 34 so as to control the plasma in the plasma chamber 10. A judgment device 38 is electrically connected to the RF probe 34. The voltage and current are be measured by the RF probe and the judgment device 38 is used to judge the state of the plasma in the plasma chamber 10.

18 Claims, 4 Drawing Sheets

PLASMA MONITORING METHOD AND SEMICONDUCTOR PRODUCTION APPARATUS

This application is a divisional of U.S. application Ser. No. 09/287,612, filed Apr. 7, 1999, now U.S. Pat. No. 6,440,260 which is hereby incorporated by reference in its entirety.

TECHNICAL FIELD

The present invention relates to methods of judging the state of a plasma used in a process of producing a semiconductor device and also to semiconductor production devices including mechanisms for judging the state of the plasma.

RELATED ART

Processes of producing a semiconductor device often include a process of forming a thin film on a semiconductor substrate. Chemical vapor deposition, sputtering, or other similar processes using a plasma may be employed as the mean for forming the thin film. To form a high-quality thin film, it is required to maintain the plasma in a particular state. To this end, it is important to precisely judge the state of the plasma used in the chemical vapor deposition process or the sputtering process.

SUMMARY

One embodiment of the present invention relates to an apparatus for producing a semiconductor device by generating or controlling a plasma using a radio-frequency wave. The semiconductor production apparatus includes radio-frequency wave generation means for generating the radio-frequency wave and an electrode disposed in a space where the plasma is generated. The apparatus also includes radio-frequency wave propagation means for propagating the radio-frequency wave generated by the radio-frequency wave generation means to the electrode. Radio-frequency voltage measurement means are positioned to measure the voltage of the radio-frequency wave propagating through the radio-frequency wave propagation means, and radio-frequency current measurement means are positioned to measure the current of the radio-frequency wave propagating through the radio-frequency wave propagation means. Judgment means are provided for judging the state of the plasma on the basis of the voltage and the current.

Another embodiment relates to a method of monitoring a plasma in a process of generating or controlling plasma using a radio-frequency wave. The method includes measuring the voltage and the current of the radio-frequency wave and judging the state of the plasma on the basis of the voltage and the current.

Still another embodiment relates to an apparatus for semiconductor device fabrication using a plasma, the apparatus including a plasma chamber having a plasma formation region. At least one generator is provided to supply energy to the plasma formation region. The apparatus also includes at least one voltage measurement device and at least one current measurement device.

Another embodiment relates to an apparatus for semiconductor device fabrication using a plasma and including a chamber having a plasma formation region. A generator and a conduit to deliver energy from the generator to the plasma formation region are provided. The apparatus also includes a voltage measurement device and a current measurement device.

Another embodiment relates to a method for monitoring a plasma during a plasma processing operation. The method includes measuring a voltage and a current in a signal. The method also includes detecting a change in at least one of the voltage and current.

Another embodiment relates to a method for monitoring a plasma during a plasma processing operation using RF energy. The method includes monitoring a voltage of an RF signal and monitoring a current of the RF signal. The method also includes detecting a first to change of the voltage and the current.

BRIEF DESCRIPTION OF THE DRAWINGS

Embodiments of the invention are described with reference to the accompanying drawings which, for illustrative purposes, are schematic and not drawn to scale.

DETAILED DESCRIPTION

Figure 1:
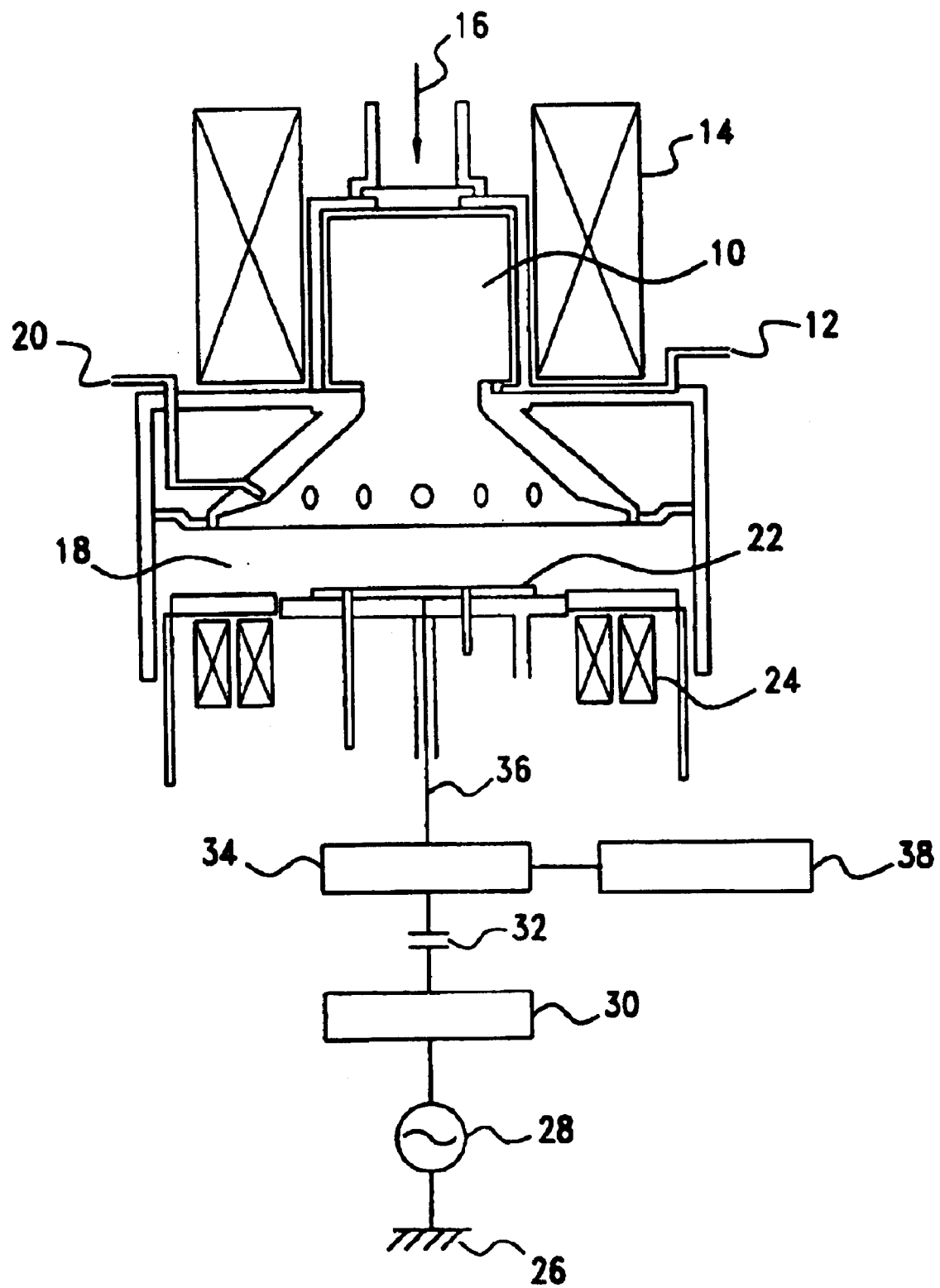
FIG. 1 is a schematic diagram of a first embodiment of a semiconductor production device according to the present invention.

Certain embodiments of the present invention relate to methods and devices for determining the state of a plasma during a plasma operation such as, for example, a deposition operation. In a system utilizing an RF power, this may be accomplished by measuring the voltage and current during the plasma operation and observing when changes to the voltage and/or current occur. Changes in the voltage and/or the current may provide an indication of the state of the plasma during the operation. Embodiments of the present invention may be preferably applied to a semiconductor production apparatus in which chemical vapor deposition or sputtering is performed using a plasma.

According to an aspect of certain embodiments of the present invention, there is provided a semiconductor production apparatus for producing a semiconductor device by generating or controlling a plasma using a radio-frequency wave. The semiconductor production apparatus includes a radio-frequency wave generation means for generating radio-frequency waves and an electrode disposed in a space where the plasma is generated. The apparatus also includes radio-frequency wave propagation means for propagating the radio-frequency waves generated by the radio-frequency wave generation means to the electrode. The apparatus also includes radio-frequency voltage measurement means, for measuring the voltage of the radio-frequency waves propagating through the radio-frequency wave propagation means, and radio-frequency current measurement means, for measuring the current of the radio-frequency waves propagating through the radio-frequency wave propagation means. Judgment means for judging the state of the plasma on the basis of the voltage and the current are also included in the apparatus.

There is a possibility that a change occurs only in either the voltage or the current of the radio-frequency wave when the state of the plasma changes. Therefore, in the semiconductor production apparatus according to certain embodiments of the present invention, both the voltage and current of the radio-frequency wave are monitored to judge the state of the plasma. More specifically, when a change occurs in a plasma during a process of forming a thin film by means of chemical vapor deposition using the plasma, there is a possibility that no change occurs in the voltage of the radio-frequency wave or there is a delay in the change in the voltage. In this case, if only the voltage is monitored, the state of the plasma cannot be correctly judged. When only the current is monitored, a similar problem can occur. In view of the above, both the voltage and current of the radio-frequency wave are monitored and the state of the plasma is precisely judged on the basis of the monitored result.

Herein, the change in the voltage or current of the radio-frequency wave refers to, for example, a change at the beginning, a change during a particular period, and a change at the end. The changes in the voltage and the current may be determined taking into account the characteristics of a material to be etched.

According to certain embodiments, the judgment means preferably judges the state of the plasma on the basis of either the voltage or the current, whichever has changed earlier than the other.

Furthermore, it is preferable that the radio-frequency wave propagation means be only one electric device which exists between the electrode and measurement means including the radio-frequency voltage measurement means and the radio-frequency current measurement means. This is because if there is a radio-frequency matching network or a blocking capacitor between the electrode and the measurement means, such an electric device can cause degradation in measurement accuracy of the voltage or the current of the radio-frequency wave. However, an electric device is allowed to be disposed between the electrode and the measurement means if the electric device does not cause degradation in measurement accuracy of the voltage or the current of the radio-frequency wave.

Preferably, the radio-frequency current measurement means measures a current flowing through a coil wound around the radio-frequency wave propagation means. This is desirable because the current flowing through the radio-frequency wave propagation means does not pass directly through the radio-frequency current measurement means and thus the radio-frequency current measurement means is not heated and no change occurs in plasma impedance. If the current of the radio-frequency wave flowing through the radio-frequency wave propagation means is directly measured, the above-described problems will occur.

According to another aspect the present invention, embodiments include a method of monitoring a plasma in a process of generating or controlling the plasma using a radio-frequency wave. The method includes measuring the voltage and the current of the radio-frequency wave, and judging the state of the plasma on the basis of the voltage and the current. In this plasma monitoring method, because the state of the plasma is judged on the basis of the voltage and the current of the radio-frequency waves, it is possible to make a precise judgment on the state of the plasma for the same reason described above with reference to the semiconductor production apparatus according to the present invention.

In the plasma monitoring method according to a preferred embodiment the present invention, the state of the plasma is judged on the basis of either the voltage or current, whichever has changed earlier than the other.

In the case where a plurality of electrodes are disposed in a space where a plasma is generated and a radio-frequency wave is applied to each electrode, it is preferable that radio-frequency voltage measurement means and radio-frequency current measurement means be provided on each radio-frequency wave propagation means electrically connected to each electrode so that the judgment can be made using a greater amount of data and thus the state of the plasma can be judged more precisely.

In the case where a radio-frequency wave is applied to an electrode and a radio-frequency wave is also applied to an induction coil, it is preferable that: (1) radio-frequency voltage measurement means and radio-frequency current measurement means be provided on the radio-frequency wave propagation means electrically connected to the electrode, and (2) radio-frequency voltage measurement means and radio-frequency current measurement means be also provided on the radio-frequency wave propagation means electrically connected to the induction coil, for the same reason described above in connection with the case where the plurality of electrodes are disposed in the space where the plasma is generated.

Several preferred embodiments of devices and methods will be described in detail with reference to the attached drawings.

FIG. 1 is a schematic diagram of a first embodiment of a semiconductor production device according to the present invention. In this first embodiment, the invention is applied to an ECR plasma CVD apparatus.

Gas such as Ar or $O_2$ used to generate a plasma is supplied into a plasma chamber 10 via a gas inlet pipe 12. A main coil 14 is disposed around the plasma chamber 10. A radio-frequency wave is applied to the plasma chamber 10.

A plasma is generated in the plasma chamber 10 and supplied into a reaction chamber 18. Reaction gas such as $SiH_4$ is supplied into the reaction chamber 18 via a gas inlet pipe 20. An electrode 22 is disposed in the reaction chamber 18. On the electrode 22, a semiconductor wafer is placed on which a thin film is to be deposited using the ECR plasma CVD apparatus. There is also provided an auxiliary coil 24.

A radio-frequency wave is generated by a radio-frequency wave generator 28 electrically connected to a ground 26. The generated radio-frequency wave is applied to the electrode 22 via a radio-frequency matching network 30, a blocking capacitor 32, and an RF probe 34, so as to control the plasma in the plasma chamber 10. These electric devices may be electrically connected in a series fashion via a lead line or interconnection wire 36 which is employed by example as the radio-frequency wave propagation means.

The RF probe 34 is an example of the measurement means including the radio-frequency voltage measurement means and the radio-frequency current measurement means. In this structure, the interconnection wire 36 is preferably the only electric device which exists between the electrode 22 and the RF probe 34.

The RF probe 34 is electrically connected to a judgment device 38. The judgment device 38 is an example of the judgment means. Of the voltage and the current of the radio-frequency wave measured by the RF probe 34, whichever has changed earlier may be used to judge the state of the plasma in the plasma chamber 10.

Figure 2:
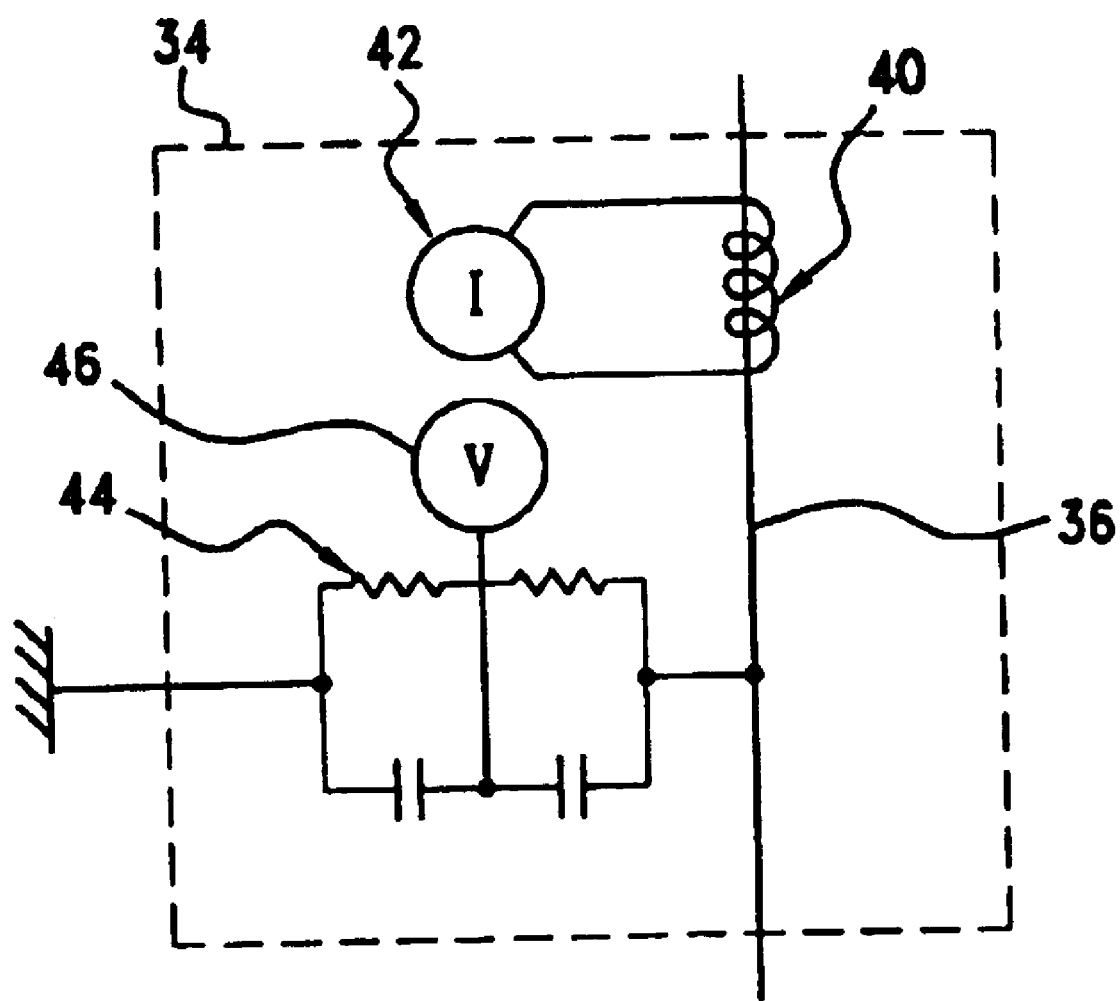
FIG. 2 is a circuit diagram of an RF probe used in the first embodiment of the semiconductor production device according to the present invention.

FIG. 2 is a circuit diagram of an embodiment of the RF probe 34. A coil 40 wound around the interconnection wire 36 is electrically connected to an ammeter 42. The ammeter 42 and the coil 40 form a current measuring device. The current measuring device is an example of the radio-frequency current measurement means. The interconnection wire 36 is electrically connected to a circuit 44 consisting of resistors and capacitors. The circuit 44 and a volt meter 46 form a voltage measuring device. The voltage measuring device is an example of the radio-frequency voltage measurement means.

The voltage and the current of the radio-frequency wave are measured with the RF probe 34 during the process of forming the thin film on the semiconductor using the plasma CVD apparatus. On the basis of either the voltage or the current which has changed earlier than the other, the judgment device 38 judges the state of the plasma in the plasma chamber 10. This technique allows the state of the plasma to be judged precisely.

Figure 3:
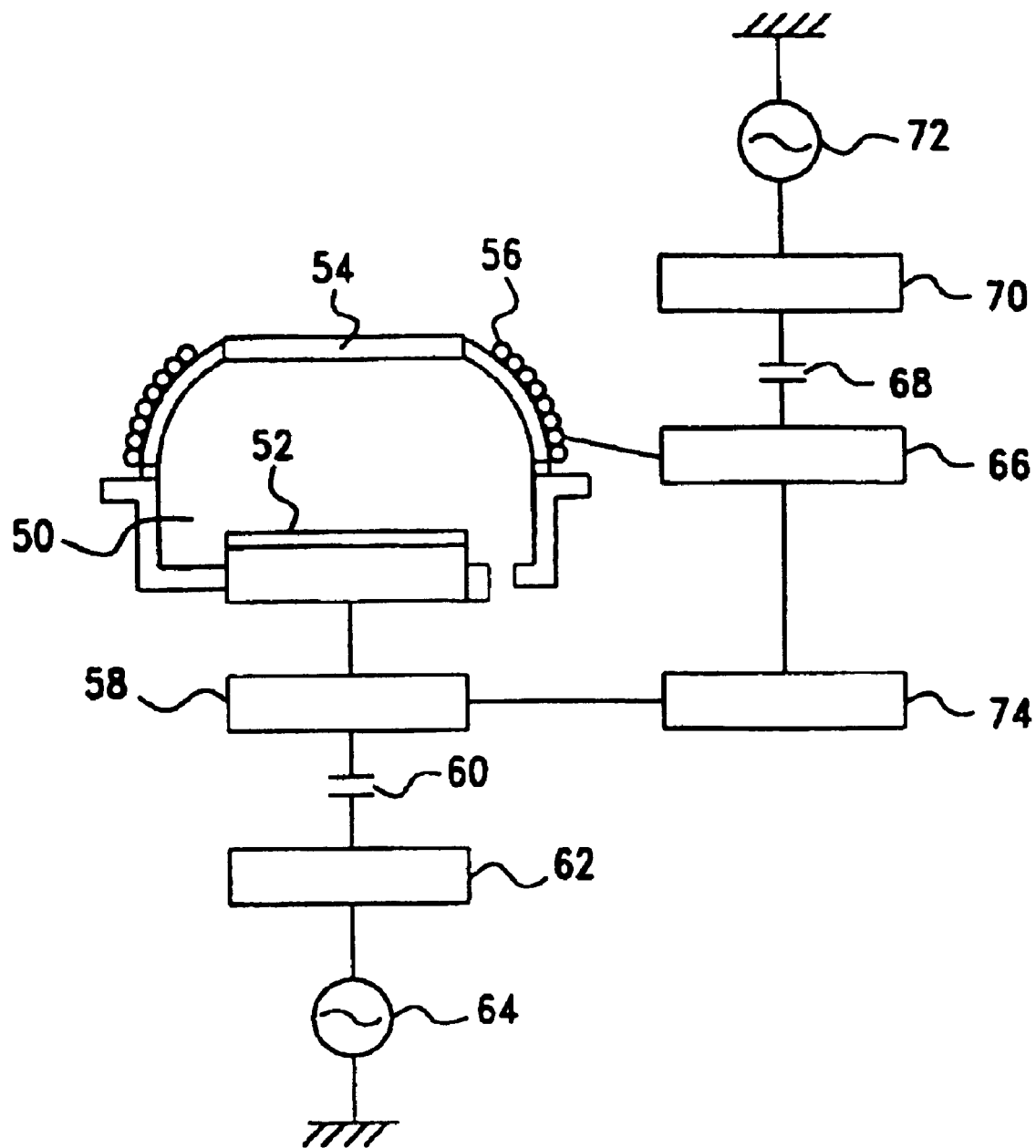
FIG. 3 is a schematic diagram of a second embodiment of a semiconductor production device according to the present invention.

FIG. 3 is a schematic diagram of a second embodiment of a semiconductor production device according to the present invention. In this second embodiment, the invention is applied to an ICP plasma CVD apparatus.

A cathode electrode 52 is disposed on the bottom of a reaction chamber 50. On the cathode electrode 52, a semiconductor wafer is placed on which a thin film is to be deposited using this plasma CVD apparatus. An anode electrode 54 is disposed at the top of the reaction chamber 50. An induction coil 56 is disposed around the reaction chamber 50.

The cathode electrode 52 is electrically connected to an RF probe 58, a blocking capacitor 60, a radio-frequency matching network 62, and a radio-frequency wave generator 64. The induction coil 56 is electrically connected to an RF probe 66, a blocking capacitor 68, a radio-frequency matching network 70, and a radio-frequency wave generator 72. The RF probes 58 and 66 are electrically connected to a judgment device 74.

The RF probes 58 and 66 are examples of the measurement means including the radio-frequency voltage measurement means and the radio-frequency current measurement means. The RF probe 58 electrically connected to the cathode electrode 52 serves as a main probe and the RF probe electrically connected to the induction coil 56 serves as an auxiliary probe. The RF probes 58 and 66 may have a similar structure to that of the RF probe 34 employed in the first embodiment.

In this embodiment, the radio-frequency voltage and current are measured with the RF probes 58 and 66, and the measured data is sent to the judgment device 74. The voltage and current measured with the RF probe 58 serving as the main probe are used as main data and the voltage and current measured with the RF probe 66 serving as the auxiliary probe are used as auxiliary data. Using these data, the state of the plasma in the reaction chamber 50 is judged. Thus, in this second embodiment, the judgment is made using a greater number of data than in the first embodiment. This allows the state of the plasma in the reaction chamber 50 to be judged in a more precise fashion.

The present invention may be applied not only to plasma CVD apparatus of the types described above with reference to the first and second embodiments, but also to any type of plasma CVD apparatus using radio-frequency waves.

Figure 4:
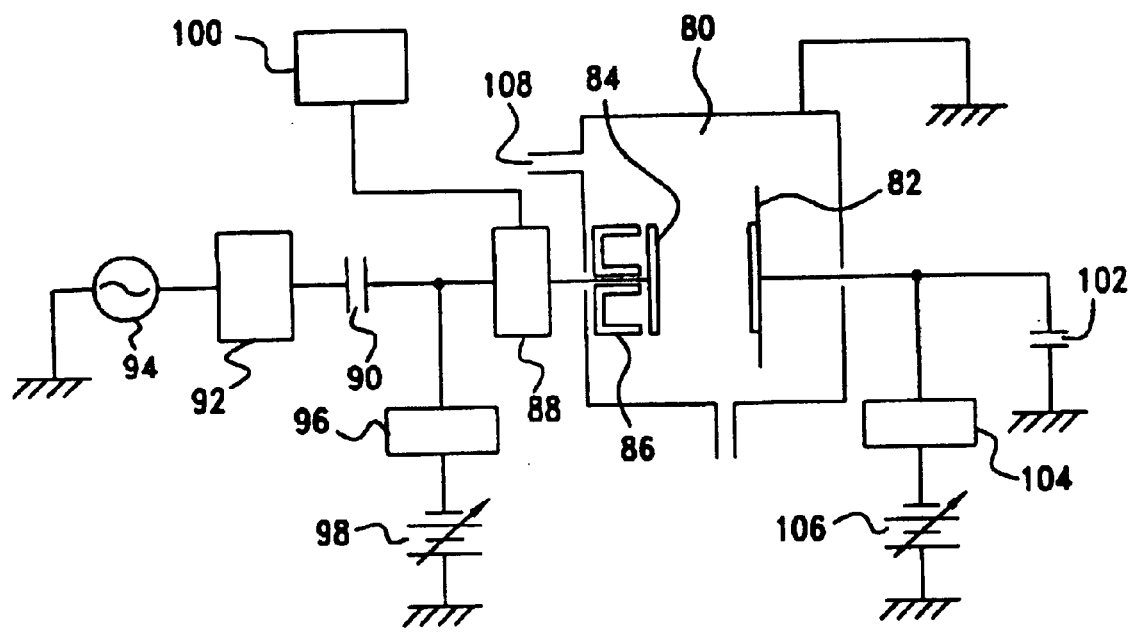
FIG. 4 is a schematic diagram of a third embodiment of a semiconductor production device according to the present invention.

FIG. 4 is a schematic diagram of a third embodiment of a semiconductor production device according to the present invention. In this third embodiment, the invention is applied to a sputtering apparatus with a bias via RF-DC coupling.

Electrodes 82 and 84 are disposed in a chamber 80 such that they face each other. On the electrode 82, a semiconductor wafer is placed on which a thin film is to be deposited using this sputtering apparatus. A target is placed on the electrode 84. A magnet 86 is placed at the back of the electrode 84.

The electrode 84 is electrically connected to an RF probe 88, a blocking capacitor 90, a radio-frequency matching network 92, and a radio-frequency wave generator 94. The RF probe 88 is electrically connected to a judgment device 100. An interconnection wire via which the RF probe 88 and the blocking capacitor 90 are electrically connected to each other is electrically connected to a DC power supply 98 via a high-frequency filter 96.

A capacitor 102 may be electrically connected to the electrode 82. An interconnection wire via which the electrode 82 and the capacitor 102 are electrically connected to each other may be electrically connected to a DC power supply 106 via a high-frequency filter 104.

Ar gas which is discharged by a radio-frequency wave into a plasma state is supplied into the chamber 80 via a gas inlet pipe 108.

The RF probe 88 may have a similar structure to that of the RF probe 34 employed in the first embodiment. In this third embodiment, the voltage and the current of the radio-frequency wave are measured with the RF probe 88 during the process of forming the thin film on the semiconductor using the sputtering apparatus. On the basis of either the voltage or the current which has changed earlier than the other, the judgment device 100 judges the state of the plasma in the chamber 80. This technique allows the state of the plasma to be judged precisely.

The present invention may be applied not only to sputtering apparatus of the type described above with reference to the third embodiment, but also to any type of sputtering apparatus in which a plasma is generated or controlled using a radio-frequency signal.

Embodiments of the present invention may include a variety of plasma system configurations using radio-frequency Hertzian waves.

Although in the first, second, and third embodiments described above, the state of the plasma is judged on the basis of either the voltage or current of the radio-frequency wave which has changed earlier than the other, the voltage or current which has change later than the other may be employed to judge the state of the plasma so as to avoid incorrect judgment caused by noise. When either the voltage or current which has changed earlier than the other is employed, there is a possibility that the employed value includes a numerical error due to noise. Such a problem can be avoided by performing the judgment when a subsequent change occurs in the current if the voltage has changed earlier or when a subsequent change occurs in the voltage if the current has changed earlier.

In certain preferred embodiments, the signal from a generator is coupled to the chamber through a conduit which permits the monitoring of both voltage and current, so that variations in the plasma can be determined from changes in the voltage and/or current. A variety of devices and methods for supplying and delivering the energy to the plasma and for monitoring the voltage and current may be utilized. By determining changes in the state of the plasma quickly and accurately, embodiments of the present invention can lead to better process control.

It will, of course, be understood that modifications of the present invention, in its various aspects, will be apparent to those skilled in the art. Other embodiments are possible, their specific features depending upon the particular application. For example, a variety of chamber and sputtering configurations using may be employed in addition to those discussed above. In addition, other types of circuitry and measuring devices could be utilized. Therefore, the scope of the invention should not be limited by the particular embodiments herein described.

What is claimed:

1. A method of monitoring a plasma in a process of generating or controlling plasma using a radio-frequency wave, the method comprising:
   measuring the voltage and the current of the radio-frequency wave; and
   judging the state of the plasma on the basis of the later to change of the voltage and the current.

2. A method of monitoring a plasma in a process of generating or controlling plasma using a radio-frequency wave, the method comprising:
   measuring the voltage and current of the radio-frequency wave; and
   judging the state of the plasma on the basis of the earlier to change of the voltage and the current.

3. A method for monitoring a plasma during a plasma processing operation, comprising:
   measuring a voltage in a signal;
   measuring a current in the signal; and
   determining a change in a condition of the plasma based on the first to change of the voltage and the current.

4. A method as in claim 3, further comprising controlling at least one processing step based on the determining a change in the state of the plasma.

5. A method as in claim 3, further comprising providing first and second probes, wherein the measuring a voltage includes measuring a voltage using both the first and second probes, and the measuring a current includes measuring a current using both the first and second probes.

6. A method for monitoring a plasma during a plasma processing operation, comprising:
   measuring a voltage in a signal;
   measuring a current in the signal;
   detecting a change in both the voltage and current;
   determining a change in the state of the plasma based on the later to change of the voltage and current.

7. A method as in claim 6, further comprising controlling at least one processing step based on the determining a change in the state of the plasma.

8. A method as in claim 6, further comprising providing first and second probes, wherein the measuring a voltage includes measuring a voltage using both the first and second probes, and the measuring a current includes measuring a current using both the first and second probes.

9. A method for monitoring a plasma during a plasma processing operation using RF energy, comprising:
   monitoring a voltage of an RF signal;
   monitoring a current of the RF signal;
   detecting a first to change of the voltage and the current.

10. A method as in claim 9, further comprising determining a change in the condition of the plasma based on the first to change of the voltage and current.

11. A method as in claim 9, further comprising detecting a second to change of the voltage and the current, and then determining a change in the condition of the plasma using the second to change of the voltage and the current.

12. A method as in claim 9, further comprising detecting a second to change of the voltage and the current, and determining a change in a condition of the plasma using at least one of: (1) the first to change of the voltage and current, and (2) the second to change of the voltage and the current.

13. A method as in claim 12, further comprising determining a change in the condition of the plasma using only the first to change of the voltage and current.

14. A method as in claim 12, further comprising detecting a second to change of the voltage and current, and determining a change in the condition of the plasma using only the second to change of the voltage and current.

15. A method for monitoring a plasma during a plasma processing operation, comprising:
   monitoring a voltage in a signal;
   monitoring a current in the signal;
   determining a change in a condition of the plasma using only one of: (1) the earlier to change of the voltage and the current, and (2) the later to change of the voltage and the current.

16. A method as in claim 15, wherein the determining a change in a condition of the plasma uses the earlier to change of the voltage and the current.

17. A method as in claim 15, wherein the determining a change in a condition of the plasma uses the later to change of the voltage and the current.

18. A method as in claim 15, wherein the monitoring a current in a signal comprises measuring an RF current flowing through a coil wound around an RF wave propagation means.

* * * * *